United States Patent [19]

Opas et al.

[11] Patent Number: 4,924,194
[45] Date of Patent: May 8, 1990

[54] RF POWER AMPLIFIER

[75] Inventors: George F. Opas, Park Ridge; Edward C. Porrett, Elgin, both of Ill.

[73] Assignee: Motorola, Inc., Schaumburg, Ill.

[21] Appl. No.: 355,205

[22] Filed: May 19, 1989

[51] Int. Cl.$^5$ .............................................. H03F 1/30
[52] U.S. Cl. .................................................. 330/289
[58] Field of Search ........................ 330/266, 272, 289

[56] References Cited

U.S. PATENT DOCUMENTS 4,677,392 6/1987 Yang ............................... 330/289 X

OTHER PUBLICATIONS

D. A. Kleinman, "The Forward Characteristic of the PIN Diode", *The Bell System Technical Journal*, May 1956, pp. 685–706.

Primary Examiner—James B. Mullins
Attorney, Agent, or Firm—Wayne J. Egan

[57] ABSTRACT

An improved RF power amplifier is disclosed whereby a PIN-type diode is utilized to provide temperature tracking for the bias supply. The PIN diode provides proper temperature tracking with the bias supply while exhibiting reduced sensitivity to self-rectification. As a result, the power amplifier's bias supply is more stable and less susceptible to inaccuracies, distortion, and oscillation that may be caused by self-rectification in the presence of high RF fields, especially at UHF and 800 MHz.

21 Claims, 1 Drawing Sheet

RF POWER AMPLIFIER

TECHNICAL FIELD

This invention pertains generally to power amplifiers and more specifically to power amplifiers for use with radio frequency (RF) signals.

BACKGROUND OF THE INVENTION

Temperature tracking of bias supplies for linear RF power amplifiers is essential for stable operation. As is known, all bipolar transistors--including RF power devices--exhibit a negative temperature coefficient in the base-emitter turn-on voltage drop. Consequently, thermal run-away will result when an RF power transistor is biased with a fixed, non-temperature-tracking voltage source.

It is accepted practice to avoid this run-away situation by using a thermally-variable device such as a diode or a diode-connected transistor mounted on the heat sink near the RF power device. This is not ideal, however, because of the thermal lag between the RF device and the sensor due to the thermal resistances and masses involved.

As is known, an improvement in response will result if the temperature-sensing diode is physically as close as possible to the transistor die contained in the RF package. In many practical cases, however, unless a special package is employed in which the sensing diode is internal and is mounted next to the transistor die, this implies mounting the sensing diode on the RF device package. A problem arises with this approach, however, since the high RF field around the RF power transistor causes rectification in the temperature-sensing diode with a polarity opposite to the bias voltage. As a result, the bias voltage decreases with increasing RF drive and the amplifier input-output transfer characteristic displays a significant non-linearity. In some severe cases, a low-frequency blocking type oscillation may also result.

As a result of the above, there is a need for an improved RF power amplifier.

SUMMARY OF THE INVENTION

Accordingly, an improved RF power amplifier is disclosed whereby a PIN-type diode is utilized to provide temperature tracking for the bias supply. The PIN diode provides proper temperature tracking with the bias supply while exhibiting reduced sensitivity to self-rectification. As a result, the power amplifier's bias supply is more stable and less susceptible in inaccuracies, distortion, and oscillation that may be caused by self-rectification in the presence of high RF fields, especially at UHF and 800 MHz.

DETAILED DESCRIPTION OF THE INVENTION

Figure 1:
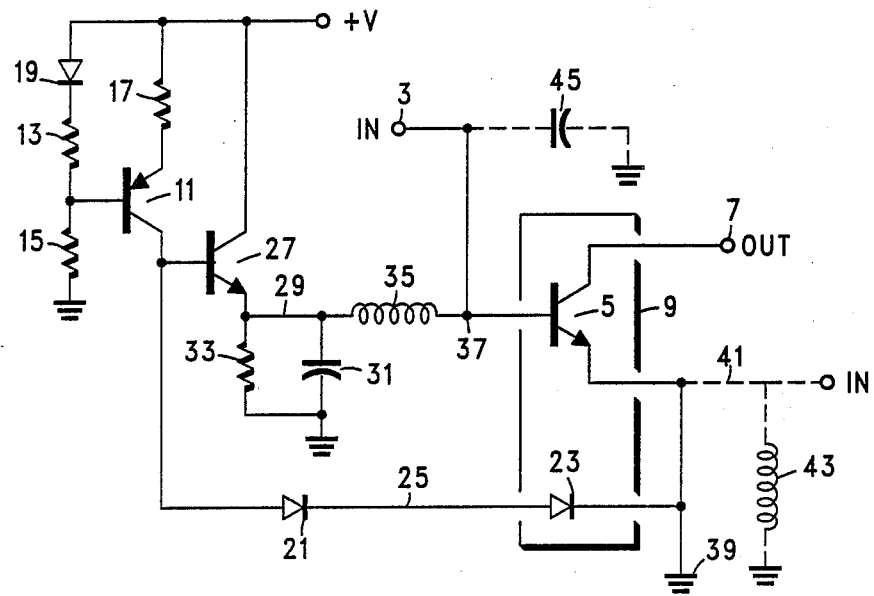
FIG. 1 is a circuit diagram showing a first embodiment of an RF power amplifier, according to the invention.

Turning now to FIG. 1, there is a circuit diagram showing a first embodiment of an RF power amplifier, according to the invention.

As shown, an RF input signal is coupled to the base of an RF power transistor 5 via lead 37, thereby generating an amplified signal at the transistor 5's collector which, in turn, is coupled to an output lead 7. The RF power transistor 5, for example, may be conveniently mounted inside an RF power transistor package 9.

Also shown is a bias source, as follows: a first transistor 11, a first resistor 13, a second resistor 15, a third resistor 17, and a first diode 19 form a temperature-compensated current source for the diode string consisting of a second diode 21 and a third diode 23 that is a PIN-type. The diodes 19 and 21 are conventional silicon devices. The PIN diode 23 is generally mounted on top of the RF power transistor package 9. The cathode of the PIN diode 23 is grounded at the RF power transistor 5 and a single wire 25 connects the PIN 23's anode to the diode 21's cathode. Diode 21 is used to temperature-compensate a second transistor 27 that couples the bias source to the RF power transistor 5. Those skilled in the art will also appreciate that transistor 27 provides bias current to the RF transistor 5 via lead 37. Also, transistor 27 acts to isolate, or buffer, the bias source from the RF power transistor 5.

The ratio of the resistor 13 and the resistor 15 establishes the current through the diode stack consisting of diode 21 and PIN diode 23, and ultimately provides a fine control of the bias voltage output 29 available at the emitter of the transistor 27. A fourth resistor 33 provides a minimum load for the transistor 27 in the absence of RF drive via the signal input 3. A capacitor 31 (low-pass) filters the bias source by averaging the bias current pulses drawn by transistor 5's base even at the lowest component of the frequency spectrum of the envelope applied to the transistor. Additionally, capacitor 31 should present a low impedance at the frequency of operation of the RF amplifier. The requirement that capacitor 31 bypass both low frequencies and RF is usually met by having capacitor 31 consist of two or more individual capacitors—each providing bypassing action at the required frequency range. Capacitor 31, in conjunction with inductor 35, comprises an RF low-pass filter and prevents, or at least impedes, RF energy from entering the bias source.

In operation, the bias voltage present on lead 37 is thermally controlled by the temperature characteristic (TC) of the PIN diode 23 which closely matches the temperature coefficient of transistor 5's "turn-on" voltage. As the RF power transistor 5 heats up, the voltage across the diode stack consisting of diode 21 and PIN diode 23 drops and lowers the bias voltage on lead 37 to compensate for the RF transistor 5's reduced base-emitter "turn-on" voltage.

The first embodiment depicted in FIG. 1 may be analyzed as follows:

The transistor 11, the diode 19, and the resistors 13, 15, and 17 form a current source that acts to maintain the current through PIN diode 23 at a constant value, thereby generating a bias voltage 25 at the anode of PIN diode 23 with respect to a fixed reference voltage, such as ground 39. This PIN bias voltage 25 is then transmitted, or coupled, to lead 37 and, in turn, to the base of the RF power output transistor 5 by a bias-coupling circuit formed by diode 21, transistor 27, resistor 33, capacitor 31 and inductor 35. As a result, the voltage at the lead 37 and, in turn, the voltage at the base of transistor 5 is essentially equal to the PIN bias voltage 25. Therefore, the difference between these two voltages is essentially zero.

To provide temperature compensation for transistor 5, PIN diode 23 is mounted in close proximity to transistor 5. Ideally, the PIN diode 23 would be mounted inside the RF power transistor package 9 next to the transistor die contained therein if fabrication of a special package were feasible. Otherwise, PIN diode 23 may be mounted on top of the RF power package 9 or as close thermally to the RF transistor die as possible. Therefore, the temperature of the PIN 23 should track (or be identical to) the temperature of transistor 5. Therefore, the difference between these two temperatures is essentially zero.

Capacitor 31 regulates or filters the bias voltage applied to the base of transistor 5 (via lead 37) in the presence of low-frequency envelope modulation. The RF filter formed by the combination of capacitor 31 and inductor 35 attenuates RF signals present on lead 37 that would otherwise tend to flow toward the bias source connected to lead 29 and potentially disrupt operation of the bias source due to rectification of RF in the transistors and diodes comprising that bias source. Further, bias current and isolation are provided by buffer transistor 27, while bising diode 21 compensates for the forward-biased base-emitter junction of transistor 27.

Referring again to FIG. 1, a second embodiment of an RF power amplifier, according to the invention, connects the transistor 5 in a common-base configuration, instead of the common-emitter configuration discussed above. This embodiment is achieved by substituting input 41 (shown in broken lines) for input 3 thereby applying the RF input signal to transistor 5's emitter, instead of the base. The emitter also is returned to ground through an inductor 43 (shown in broken lines) which presents a high impedance to the RF drive signal present at input 41. Finally, transistor 5's base is provided with a good RF bypass to ground through a capacitor 45 (shown in broken lines). The output 7 remains coupled to the collector of transistor 5. It will be apparent to those skilled in the art that the DC and biasing connections for the resulting common-base configuration are identical to the common-emitter configuration. This second embodiment therefore enjoys the same benefits as the first embodiment discussed above.

One advantage of the invention over the prior art is accurate and rapid-tracking temperature sensing in the presence of substantial RF fields. Another advantage is physical simplification and reduced manufacturing costs through the elimination of bypassing and decoupling components that would be required with a conventional diode temperature sensor.

Potential applications for this invention include linear RF power amplifiers for RF transmitters employing any spectrally efficient modulation scheme that generates envelope modulation as part of the modulation format. Such spectrally efficient non-constant envelope schemes include QAM, filtered QPSK and SSB. Another potential application would be in linear RF power amplifiers used as common power amplifiers to amplify several channels simultaneously. Such applications, for example, may become popular for digital cellular base stations.

While various embodiments of the RF power amplifier, according to the invention, have been described herein, the scope of the invention is defined by the following claims.

What is claimed is:

1. A power amplifier comprising:
   a current source, an output transistor having a base, emitter, and collector, and a voltage reference ($V_{ref}$),
   said output transistor emitter coupled to said $V_{ref}$;
   a PIN-type diode (PIN) having a first terminal and a second terminal,
   said current source coupled to said PIN so that the current through said PIN is maintained at a substantially fixed level,
   one of said PIN terminals coupled to said $V_{ref}$ so that, when said output transistor base and said PIN are forward biased, the sense of the voltage at the other PIN terminal ($V_{PIN}$) is the same as the sense of the voltage at said output transistor base, said voltages being measured with respect to said $V_{ref}$;
   a bias coupling circuit, and a signal input;
   said output transistor base coupled to said bias coupling circuit and to said signal input;
   said signal input having means for coupling an input signal to said output transistor base;
   said $V_{PIN}$ coupled to said bias coupling circuit;
   said bias coupling circuit having means for maintaining the difference between said $V_{PIN}$ and the voltage at said output transistor base to substantially equal zero;
   said power amplifier having means for maintaining the difference between the temperature of said PIN and the temperature of said output transistor to substantially equal zero.

2. The power amplifier of claim 1 wherein said input signal comprises a radio frequency (RF) signal.

3. The power amplifier of claim 2 wherein said bias coupling circuit includes a low-pass filter (LPF) coupled in series with said output transistor base, said LPF having means for regulating the voltage at said output transistor base.

4. The power amplifier of claim 3 wherein said bias coupling circuit includes an inductor (L) coupled in series with said output transistor base.

5. The power amplifier of claim 4 wherein said bias coupling circuit includes a buffer transistor having a base, emitter, and collector, said buffer transistore emitter coupled in series with said LPF, said buffer transistor base coupled to said $V_{PIN}$.

6. The power amplifier of claim 5 wherein said bias coupling circuit includes a biasing diode (D) having a first terminal and a second terminal, one of D's terminals coupled in series with $V_{PIN}$ so that D is forward-biased when said PIN is forward biased, the other of D's terminals coupled to said buffer transistor base.

7. The power amplifier of claim 6 wherein said PIN is located in close physical proximity to said output transistor.

8. The power amplifier of claim 7 wherein said output transistor is mounted inside an RF power transistor package and said PIN is mounted on top of said RF power transistor package.

9. The power amplifier of claim 7 wherein said output transistor is mounted inside an RF power transistor package and said PIN is mounted inside said RF power transistor package.

10. The power amplifier of claim 9 wherein said PIN is located immediately next to said output transistor.

11. A power amplifier comprising:
    a current source, a signal input, an output transistor having a base, emitter, and collector, and a voltage reference ($V_{ref}$),
    said output transistor emitter coupled to said $V_{ref}$ and to said signal input;
    a PIN-type diode (PIN) having a first terminal and a second terminal, said current source coupled to said PIN so that the current through said PIN is maintained at a substantially fixed level, one of said PIN terminals coupled to said $V_{ref}$ so that, when said output transistor base and said PIN are forward biased, the sense of the voltage at the other PIN terminal ($V_{PIN}$) is the same as the sense of the voltage at said output transistor base, said voltages being measured with respect to said $V_{ref}$;

a bias coupling circuit;

said output transistor base coupled to said bias coupling circuit;

said signal input having means for coupling an input signal to said output transistor emitter;

said $V_{PIN}$ coupled to said bias coupling circuit;

said bias coupling circuit having means for maintaining the difference between said $V_{PIN}$ and the voltage at said output transistor base to substantially equal zero;

said power amplifier having means for maintaining the difference between the temperature of said PIN and the temperature of said output transistor to substantially equal zero.

12. The power amplifier of claim 11 wherein said input signal comprises a radio frequency (RF) signal.

13. The power amplifier of claim 12 wherein said bias coupling circuit includes a low-pass filter (LPF) coupled in series with said output transistor base, said LPF having means for regulating the voltage at said output transistor base.

14. The power amplifier of claim 13 wherein said bias coupling circuit includes an inductor (L) coupled in series with said output transistor base.

15. The power amplifier of claim 14 wherein said bias coupling circuit includes a buffer transistor having a base, emitter, and collector, said buffer transistor emitter coupled in series with said LPF, said buffer transistor base coupled to said $V_{PIN}$.

16. The power amplifier of claim 15 wherein said bias coupling circuit includes a biasing diode (D) having a first terminal and a second terminal, one of D's terminals coupled in series with $V_{PIN}$ so that D is forward-biased when said PIN is forward biased, the other of D's terminals coupled to said buffer transistor base.

17. The power amplifier of claim 16 wherein said PIN is located in close physical proximity to said output transistor.

18. The power amplifier of claim 17 wherein said output transistor is mounted inside an RF power transistor package and said PIN is mounted on top of said RF power transistor package.

19. The power amplifier of claim 17 wherein said output transistor is mounted inside an RF power transistor package and said PIN is mounted inside said RF power transistor package.

20. The power amplifier of claim 19 wherein said PIN is located immediately next to said output transistor.

21. A linear RF power amplifier including an output transistor and a thermally-variable device thermally adjacent to said output transistor, said thermally-variable device thermally responsive to said output transistor and having means for providing temperature compensation for said output transistor, the improvement comprising:

said thermally-variable device including a PIN-type diode.

* * * * *